(12) United States Patent
Ligtenberg et al.

(10) Patent No.: US 8,801,054 B2
(45) Date of Patent: Aug. 12, 2014

(54) ELECTRONIC DEVICE AND MAGNETIC LATCHING MECHANISM THEREFOR

(71) Applicant: Apple Inc., Cupertino, CA (US)

(72) Inventors: Chris Ligtenberg, San Carlos, CA (US); Brett Degner, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/685,515

(22) Filed: Nov. 26, 2012

(65) Prior Publication Data

US 2013/0094142 A1 Apr. 18, 2013

Related U.S. Application Data

(60) Continuation of application No. 12/831,505, filed on Jul. 7, 2010, now abandoned, which is a division of application No. 11/302,907, filed on Dec. 13, 2005, now Pat. No. 7,775,567.

(51) Int. Cl.
*E05C 17/56* (2006.01)
*E05C 19/16* (2006.01)

(52) U.S. Cl.
USPC ............................ 292/251.5; 292/177

(58) Field of Classification Search
USPC .............. 292/251.5, 163, 177–182
See application file for complete search history.

(56) References Cited

U.S. PATENT DOCUMENTS

| | | | |
|---|---|---|---|
| 2,471,634 A | 5/1949 | Vennice et al. | |
| 2,475,226 A | 7/1949 | Ellis | |
| 2,584,480 A | 2/1952 | Manting | |
| 2,735,740 A | 2/1956 | Scans | |
| 3,204,154 A | 8/1965 | Crandell | |
| 3,468,576 A | 9/1969 | Beyer et al. | |
| 3,620,560 A | 1/1971 | Peters | |
| 3,647,165 A | 3/1972 | Whitla | |
| 3,658,370 A | 4/1972 | Wang | |
| 3,790,197 A | 2/1974 | Parker | |

(Continued)

FOREIGN PATENT DOCUMENTS

| | | |
|---|---|---|
| EP | 99223 A2 | 1/1984 |
| GB | 2236139 A | 3/1991 |
| GB | 2264975 A | 9/1993 |
| JP | 04185880 A | 7/1992 |

OTHER PUBLICATIONS

U.S. Non-Final Office Action for U.S. Appl. No. 12/831,505, Dated Jan. 4, 2013.

*Primary Examiner* — Carlos Lugo
(74) *Attorney, Agent, or Firm* — Womble Carlyle Sandridge & Rice LLP

(57) ABSTRACT

A magnetic latch for a display of a laptop computer uses magnetic attraction to maintain the display closed and uses magnetic repelling forces to pop-up the display when opened. The latch includes one or more magnetic elements in the body of the laptop and at least one magnetic element in the display. When the display is closed, the magnet element in the display is positioned adjacent the magnet element in the body having an opposite polarity so that the magnet elements are attracted to one another. To pop-up the display, the user moves the magnetic element in the display so that it meets the magnetic pole in the body having the same polarity. When these meet, the repelling force between them causes the display to open slightly so that a user can then readily open the display.

8 Claims, 7 Drawing Sheets

(56) References Cited

U.S. PATENT DOCUMENTS

| | | |
|---|---|---|
| 4,363,403 A | 12/1982 | Raucci et al. |
| 4,660,871 A | 4/1987 | Arakawa et al. |
| 4,669,766 A | 6/1987 | Hanchet |
| 4,696,550 A | 9/1987 | Shionoya |
| 4,901,261 A | 2/1990 | Fuhs |
| 4,964,661 A | 10/1990 | Cadwell |
| 4,982,303 A | 1/1991 | Krenz |
| 5,253,142 A | 10/1993 | Weng |
| 5,351,812 A | 10/1994 | Eagon |
| 5,409,275 A | 4/1995 | Yoshida |
| 5,466,166 A | 11/1995 | Law et al. |
| 5,488,522 A | 1/1996 | Peace et al. |
| 5,497,296 A | 3/1996 | Satou et al. |
| 5,510,953 A | 4/1996 | Merkel |
| 5,515,237 A | 5/1996 | Ogami et al. |
| 5,555,157 A | 9/1996 | Moller et al. |
| 5,574,625 A | 11/1996 | Ohgami et al. |
| 5,576,929 A | 11/1996 | Uchiyama et al. |
| 5,580,107 A | 12/1996 | Howell |
| 5,612,831 A | 3/1997 | Gallo et al. |
| 5,631,618 A | 5/1997 | Trumper et al. |
| 5,721,669 A | 2/1998 | Becker et al. |
| 5,737,185 A | 4/1998 | Morrison et al. |
| 5,740,012 A | 4/1998 | Choi |
| 5,809,520 A | 9/1998 | Edwards et al. |
| 5,812,370 A | 9/1998 | Moore et al. |
| 5,818,182 A | 10/1998 | Viswanadham et al. |
| 5,825,616 A | 10/1998 | Howell et al. |
| 5,841,631 A | 11/1998 | Shin et al. |
| 5,959,833 A | 9/1999 | Youens |
| 5,969,941 A | 10/1999 | Cho |
| 6,010,344 A | 1/2000 | Muramatsu et al. |
| 6,049,453 A | 4/2000 | Hulsebosch |
| 6,068,307 A | 5/2000 | Murphy |
| 6,115,239 A | 9/2000 | Kim |
| 6,129,395 A | 10/2000 | Schlesener et al. |
| 6,151,486 A | 11/2000 | Holshouser et al. |
| 6,256,194 B1 | 7/2001 | Choi et al. |
| 6,324,052 B1 | 11/2001 | Azima et al. |
| 6,366,440 B1 | 4/2002 | Kung |
| 6,370,376 B1 | 4/2002 | Sheath |
| 6,474,120 B1 * | 11/2002 | Wadsworth et al. ............ 70/276 |
| 6,510,048 B2 | 1/2003 | Rubenson et al. |
| 6,542,372 B1 | 4/2003 | Paquin et al. |
| 6,653,919 B2 | 11/2003 | Shih-Chung et al. |
| 6,659,516 B2 | 12/2003 | Wang et al. |
| 6,842,332 B1 | 1/2005 | Rubenson et al. |
| 6,929,291 B2 | 8/2005 | Chen |
| 6,971,147 B2 | 12/2005 | Halstead |
| 7,042,713 B2 | 5/2006 | Nicolosi |
| 7,082,035 B2 | 7/2006 | Kim |
| 7,250,207 B1 | 7/2007 | Heal et al. |
| 7,259,970 B2 | 8/2007 | Nakayabu |
| 7,286,369 B2 | 10/2007 | Yaor |
| 7,332,990 B2 | 2/2008 | Lo et al. |
| 7,390,035 B2 * | 6/2008 | Karcz et al. .................. 292/163 |
| 7,486,165 B2 | 2/2009 | Ligetenberg et al. |
| 7,775,567 B2 | 8/2010 | Ligetenberg et al. |
| 8,373,526 B2 * | 2/2013 | Fullerton et al. ............. 335/285 |
| 8,395,467 B2 * | 3/2013 | Fullerton et al. ............. 335/285 |
| 8,505,989 B2 * | 8/2013 | Wells .......................... 292/251.5 |
| 2002/0043608 A1 | 4/2002 | Nakata et al. |
| 2004/0174670 A1 | 9/2004 | Haung et al. |
| 2004/0197713 A1 | 10/2004 | Ohfuji et al. |
| 2005/0000327 A1 | 1/2005 | Monroig et al. |
| 2005/0018393 A1 | 1/2005 | Kuo et al. |
| 2005/0083644 A1 | 4/2005 | Song |
| 2005/0142936 A1 | 6/2005 | Sung et al. |
| 2005/0167992 A1 | 8/2005 | Lo et al. |
| 2005/0236848 A1 | 10/2005 | Kim |
| 2006/0006674 A1 | 1/2006 | Kang et al. |
| 2006/0023408 A1 | 2/2006 | Schlesener et al. |
| 2007/0159033 A1 | 7/2007 | McBroom et al. |
| 2008/0174127 A1 | 7/2008 | Kim et al. |

\* cited by examiner

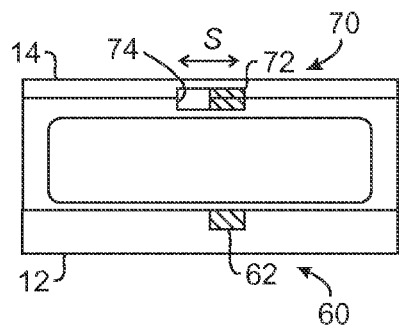
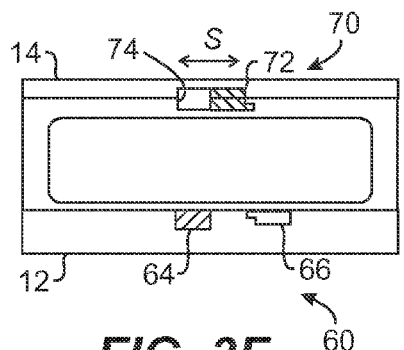
FIG. 3E  FIG. 3F
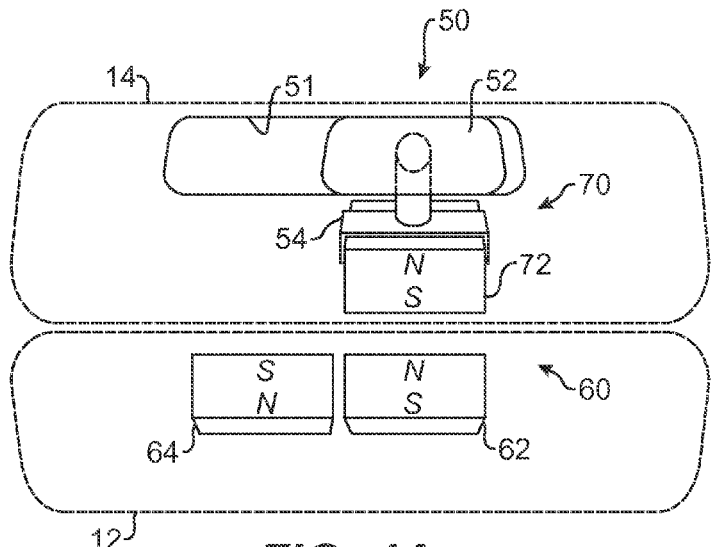
FIG. 4A
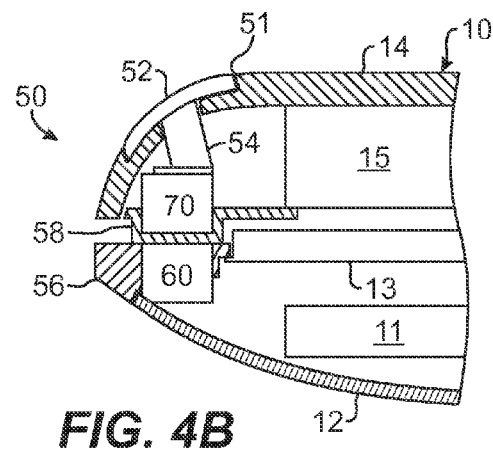
FIG. 4B

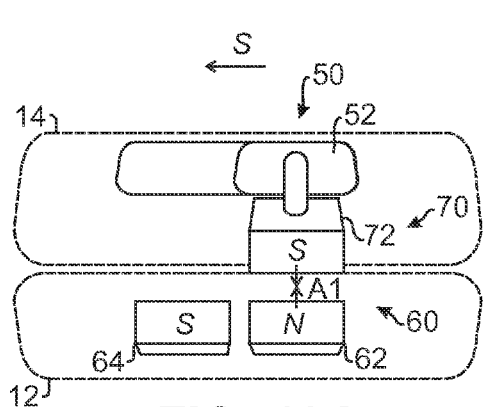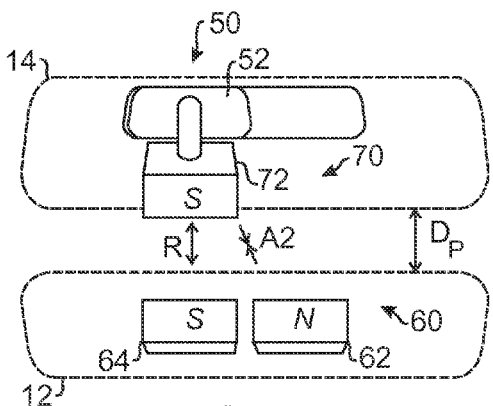
FIG. 10A          FIG. 10B
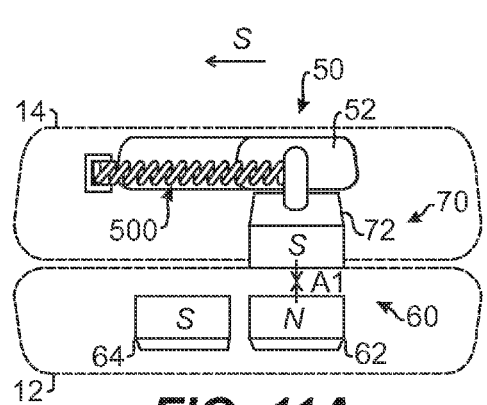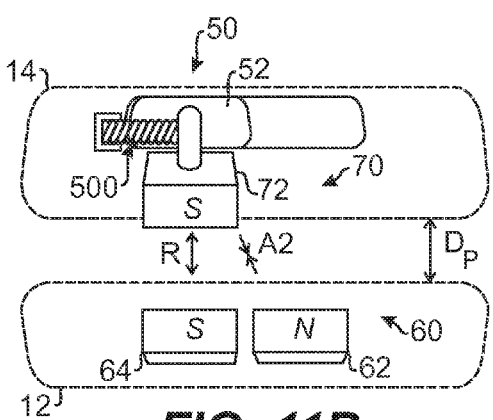
FIG. 11A          FIG. 11B
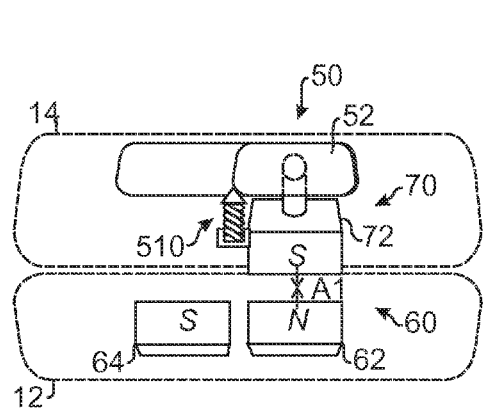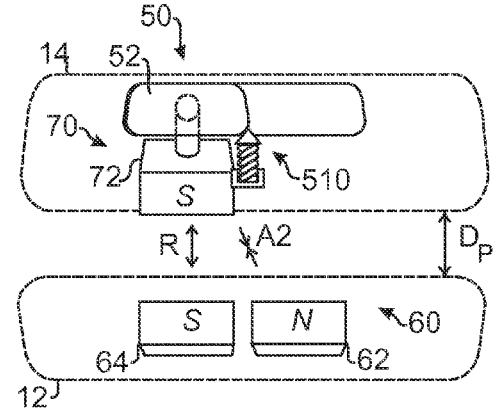
FIG. 12A          FIG. 12B

ELECTRONIC DEVICE AND MAGNETIC LATCHING MECHANISM THEREFOR

CROSS-REFERENCE TO RELATED APPLICATIONS

This application is a continuation of U.S. patent application Ser. No. 12/831,505, filed Jul. 7, 2010, which is a divisional of U.S. patent application Ser. No. 11/302,907, filed Dec. 13, 2005, now U.S. Pat. No. 7,775,567, each of which is hereby incorporated by reference in its entirety, and which was filed concurrently with U.S. patent application Ser. No. 11/302,801, now U.S. Pat. No. 7,583,500, which is incorporated herein by reference in its entirety.

FIELD OF THE DISCLOSURE

The subject matter of the present disclosure generally relates to a latch for a laptop computer and more particularly relates to a magnetic latch for a laptop computer that uses magnetic attraction to keep the display closed and uses magnetic repulsion to pop-up the display for opening.

BACKGROUND OF THE DISCLOSURE

Laptop or network computers have a body housing internal components and have a display attached to the body. The display is typically hinged to the body so that the display can be opened and closed relative to the body. In the past, mechanical latches have been used on laptop displays to maintain the display closed against the body. The latch mechanisms typically have a hook and catch interlock or similar arrangement that is activated using a button, slider, or the like. To open the display, a user disengages the hook and catch mechanism and then pivots the display on its hinges open from the body. Once the latch is disengaged, the user must pry open the display by hand.

It is known in the art to use a magnet with a hook and catch interlock. Referring to FIGS. 1A-1B, a laptop computer 10 with a display hingedly connected to a body is illustrated. The laptop 10 has a hook and catch interlock 30 according to the prior art that uses a magnet 38. A hook 32 is positioned on the display 14, and a catch 36 is positioned in the body 12. When the display 14 is closed, the hook 32 is engaged with the catch 36 to maintain the display 14 closed. To open the display 14, a slideable button 34 on the body 12 is used to disengage the hook 32 from the catch 36, and a counterbalance clutch 20 causes the display 14 to pop open by a small amount, which allows a user to use the edge of the display 14 to open it. In contrast with the more common hook and catch interlocks, the hook 32 shown in FIGS. 1A-1B is biased by a spring (not shown) and stows away within a recess 40 of the display 14 when not in use (e.g., when the display 14 is open). When a user closes the display 14 against the body 12, a magnet 38 deploys the hook 32 from its stowed position so that the hook 32 can engage the catch 36 through an opening 42 in the body 30.

To facilitate opening of the display 14, it is known in the art to use a counterbalance clutch 20 at the hinge of the display 14 and body 12. To produce the counterbalance clutch 20, thrust washers, Omega clips, or bands are typically located at the hinge(s) between the display 14 and body 12. When the display 14 is closed and locked against the body 12 with the latch mechanism 30, the display 14 acts against the counterbalance clutch 20 so that the locked display 14 is biased to open. When the latch mechanism 30 is released, the existing bias in the display 14 is released, causing the display 14 to pop-up or open slightly from the body 12. A typical clutch/display weight threshold is about 400-grams. The pop-up of the display 14 then allows a user to fit a portion of a finger under the edge of the display 14 to help them better pry the display 14 open. Displays 14 with counterbalanced clutches 20 are typically referred to as "pop-up displays."

Unfortunately, several structural issues with prior art hook and catch interlocks and counterbalance clutches pose problems for designers of laptop computers. Although these prior art mechanisms are effective, they are susceptible to breakage. For example, a hook, catch, or spring of a latch mechanism can break simply through use, rendering the display incapable of being locked closed. If a hinge between a display and a body has been slightly damaged, portions of a latch mechanism may be misaligned and not work properly. In addition, portions of the latch mechanism such as the hook may be exposed on the display or the body after opening and can be broken inadvertently.

Likewise, structural issues with prior art counterbalance clutches pose problems for laptop designers. The counterbalance clutches are typically located at the one or more hinges between the display and the body. To produce the pop-up, these clutches are biased or loaded when the display is closed against the body. Thus, the clutches have built in stresses that can cause failure over time. These clutches can also be damaged if the display is inadvertently moved relative to the body in unwanted directions. For example, when the display is closed and the clutches are loaded, any injury to the hinge area by dropping the laptop can damage the clutch and/or hinges.

Therefore, a need exists for a latch of a laptop display that overcomes structural issues inherent with the mechanical hook and catch mechanism found in the art. In addition, a need exists for a pop-up display that overcomes structural issues inherent with the counterbalance clutches found in the art. The subject matter of the present disclosure is directed to overcoming, or at least reducing the effects of, one or more of the problems set forth above.

SUMMARY OF THE DISCLOSURE

A magnetic latch for a display of a laptop computer is disclosed. The latch uses magnetic attraction to maintain the display closed. The latch also uses magnetic repelling forces to pop-up the display when a user wants to open the laptop. In one embodiment, the latch includes at least one first magnetic elements positioned in the body of the laptop and includes at least one second magnetic element positioned in the display. The first magnet element in the body is arranged so that opposite polarities are positioned towards the second magnet element in the display. When the display is closed, the second magnet element in the display is positioned adjacent the first magnet element in the body having the opposite polarity to that the first and second magnet elements are attracted to one another. To pop-up the display, the user moves (e.g., slides, turns, pushes, rotates, flips) the second magnet element in the display so that it meets the first magnet element having the same polarity. When these meet, the repelling force between them causes the display to open an amount that allows the user to then readily open the display. In one embodiment, the first and second magnetic elements can both be permanent magnets. In an alternative embodiment, one or more of the first magnetic elements can be electromagnets while the second magnetic element can be a permanent magnet.

The foregoing summary is not intended to summarize each potential embodiment or every aspect of the present disclosure.

BRIEF DESCRIPTION OF THE DRAWINGS

The foregoing summary, preferred embodiments, and other aspects of subject matter of the present disclosure will be best understood with reference to a detailed description of specific embodiments, which follows, when read in conjunction with the accompanying drawings, in which:

FIGS. 3A-3F illustrate various embodiments of the disclosed latch and pop-up mechanism according to certain teachings of the present disclosure.

FIGS. 4A-4B illustrate an embodiment of a button arrangement for moving a first magnetic component relative to a second magnetic component.

FIGS. 10A-10B illustrate an embodiment for resetting magnetic components according to certain teachings of the present disclosure.

FIGS. 11A-11B illustrate another embodiment for resetting magnetic components according to certain teachings of the present disclosure.

FIGS. 12A-12B illustrate yet another embodiment for resetting magnetic components according to certain teachings of the present disclosure.

Figure 1A:
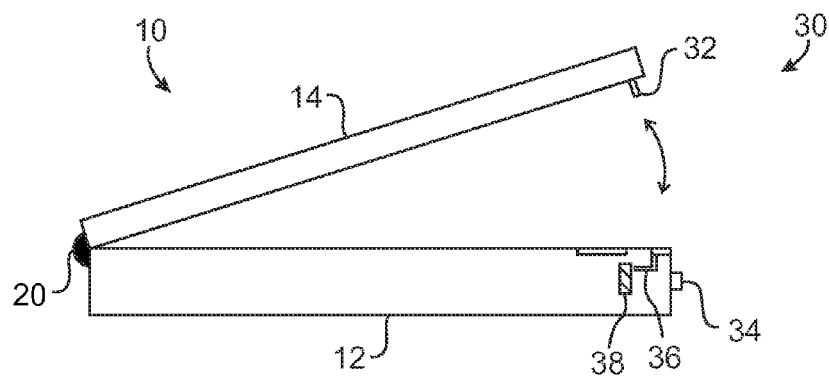
FIGS. 1A-1B illustrates a laptop computer with a display hingedly connected to a body and having a latch mechanism and a pop-up clutch according to the prior art.
Figure 1B:
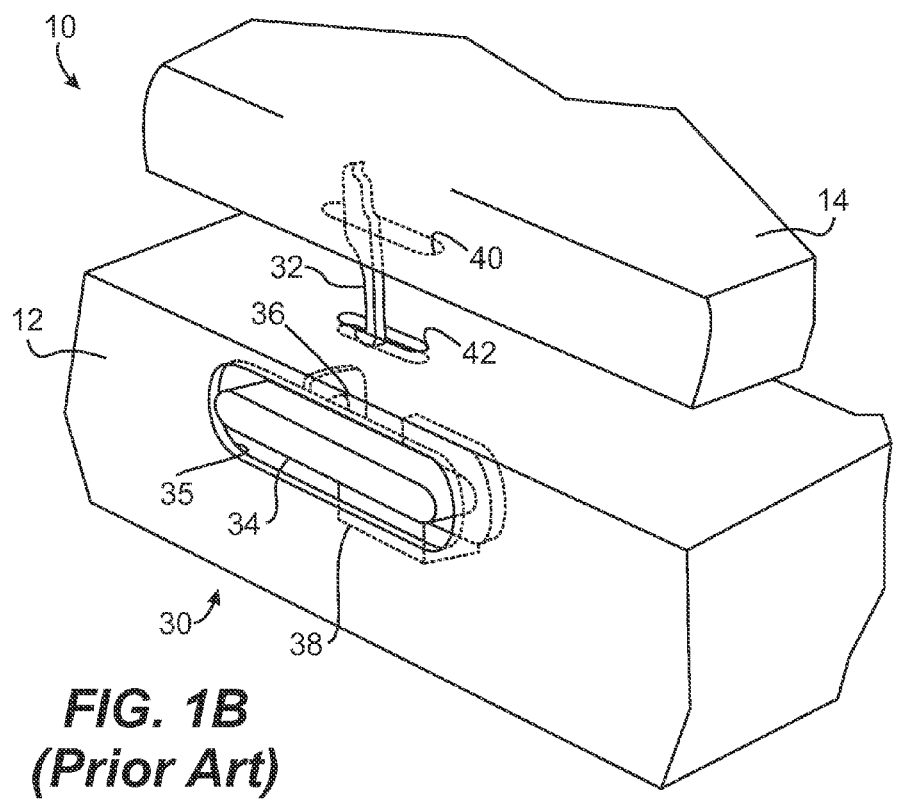

While the disclosed latch and pop-up mechanisms are susceptible to various modifications and alternative forms, specific embodiments thereof have been shown by way of example in the drawings and are herein described in detail. The figures and written description are not intended to limit the scope of the inventive concepts in any manner. Rather, the figures and written description are provided to illustrate the inventive concepts to a person skilled in the art by reference to particular embodiments, as required by 35 U.S.C. §112.

DETAILED DESCRIPTION

Figure 2A:
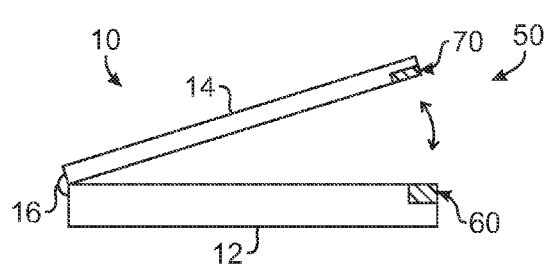
FIGS. 2A-2B illustrate a laptop computer having a display hingedly connected to a body and having a latch and pop-up mechanism according to certain teachings of the present disclosure.
Figure 2B:
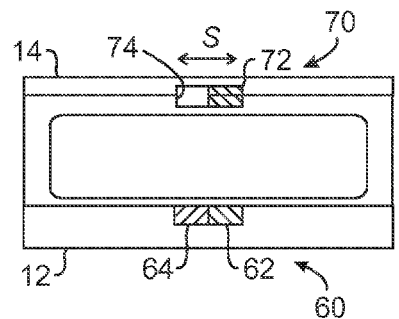

Referring to FIGS. 2A-2B, an electronic device 10 is illustrated in a side view and a front view. In the present example, the electronic device 10 is a laptop computer having a body 12 for internal electronics (not shown) and having a visual display 14 hingedly connected to the body 12 by a hinge 16. It will be appreciated, however, that the teachings of the present disclosure are applicable to other electronic devices, such as portable CD or DVD players, PDAs, calculators, and cell phones, for example, which have first and second body portions hingedly connected together and which can further have a display on the first body hingedly connected to the second body having internal electronics.

The electronic device 10 has a latch and pop-up mechanism 50 according to certain teachings of the present disclosure. In the present embodiment, the disclosed mechanism 50 achieves latching of the display 14 to the body 12 and achieves pop-up of the display 14 from the body 12. Although shown slightly open in FIGS. 2A-2B, the display 14 positions adjacent the body 12 when fully closed and positions at about 130-degrees to the body 12 when fully open.

The disclosed mechanism 50 includes a first component 60 positioned on the body 12 and a second component 70 positioned on the display 14. As best shown in the front view of FIG. 2B, the first component 60 on the body 12 has a first magnetic element 62 positioned adjacent a second magnetic element 64. The second component 70 on the display 14 includes a movable magnetic element 72 capable of having an open state and a closed state. In the present embodiment, the magnetic element 72 is movable (e.g., slideable in a slot 74 on the display 14) to produce the open and closed states.

The movable element 72 is magnetically attracted to the first magnetic element 62 when the display 14 is closed against the body 12 and the movable element 72 has the closed state (i.e., when slid to the right position in FIG. 2B). In this way, the magnetic interaction between the first element 62 and movable element 72 act to magnetically attract the display 14 to the body 12 to maintain the display closed. Conversely, the movable element 72 is magnetically repulsed by the second magnetic element 64 when the movable element 72 has the open state (i.e., when slid to the left position in FIG. 2B) while the display 14 is closed. In this way, the magnetic interaction between the second element 64 and movable element 72 act to magnetically repel the display 14 from the body 12 to pop-up the display 14. A pop-up of about 6-mm between front edges of the display 14 and body 12 has been found to be an appropriate distance to allow a user to gain access to the edge of the display 14 and readily pry the display 14 open from the body 12.

In one embodiment, the first magnetic element 62 is composed of a ferromagnetic material, and the second magnetic element 64 is a permanent magnet. For example, the ferromagnetic material can be steel, and the permanent magnet can be a rare earth permanent magnet. The permanent magnet 64 has a first polarity (e.g., North polarity) relative to the display 14. In this embodiment, the movable element 72 is a permanent magnet having an opposite polarity (e.g., South polarity) to that of the second magnetic element 64. In this way, the movable element 72 in the closed state (e.g., right position) is attracted to the ferromagnetic material 62 to maintain the display 14 closed. When the user moves the movable element 72 to the open state (e.g., left position), the movable element 72 is repelled by the permanent magnet 64 on the body 12, which causes the display 14 to pop-up a distance from the body 12.

In another embodiment, the first magnetic element 62 is a permanent magnet having a first polarity (e.g., North polarity), and the second magnetic element is a permanent magnet having an opposite polarity (e.g., South polarity) to the first polarity. In this embodiment, the movable element 72 is a permanent magnet having the same polarity (e.g., North polarity) as the first polarity of the first element 62. In this way, the movable element 72 in the closed state (e.g., right position) is attracted to the first permanent magnet 62 to maintain the display 14 closed. Likewise, the movable element 72 in the open state (e.g., left position) is repulsed by the second permanent magnet 64 to make the display pop-up a distance from the body 12.

Table 1 below provides repulsion values in grams at various distances for various combinations and sizes of rare earth permanent magnets.

| | Top Magnet (Y × Z × X mm) | Bot Magnet (Y × Z × X mm) | PM Orientation | Repulsion @ 6.55 mm | Repulsion @ 5 mm | Repulsion @ 3.5 mm |
|---|---|---|---|---|---|---|
| 1 | 5.5 × 4.0 × 48 | 5.5 × 2.5 × 48 | vertical | 558 | 881 | 1424 |
| | | | horizontal | 675 | 1018 | 1610 |
| 2 | 5.5 × 4.0 × 48 | 5.5 × 2.0 × 48 | vertical | 477 | 749 | 1228 |
| | | | horizontal | 572 | 871 | 1394 |
| 3 | 5.0 × 4.0 × 48 | 5.0 × 2.5 × 48 | vertical | 489 | 778 | 1292 |
| | | | horizontal | 577 | 886 | 1439 |
| 4 | 4.5 × 4.0 × 48 | 4.5 × 2.5 × 48 | vertical | 416 | 675 | 1145 |
| | | | horizontal | 484 | 758 | 1257 |
| 5 | 4.0 × 4.0 × 48 | 4.0 × 2.5 × 48 | vertical | 347 | 568 | 988 |
| | | | horizontal | 396 | 631 | 1072 |
| 6 | 5.0 × 4.5 × 48 w/1-mm radii | 5.0 × 2.0 × 48 | vertical | 445 | 705 | 1174 |
| | | | horizontal | 528 | 807 | 1316 |

For example, in the sixth combination of Table 1, the top magnet is 5.0×4.5×48-mm in dimension, while the bottom magnet is 5.0×2.0×48-mm in dimension. When arranged vertical to one another with the same polarities to produce repulsion (i.e., with only one pole of each magnet positioned relative to the same pole of the other magnet), the top and bottom magnets exhibit repulsion values of 445, 705, and 1174-grams at the distances of 6.55-mm, 5.0-mm, and 3.5-mm, respectively. On the other hand, these same top and bottom magnets arranged horizontally with the same polarities to produce repulsion (i.e., with both poles of each magnet positioned relative to the same poles of the other magnet) exhibit greater repulsion values of 528, 807, and 1316-grams at the distances of 6.55-mm, 5.0-mm, and 3.5-mm, respectively.

Table 2 below provides attraction values in grams at various distances for the same combinations and sizes of rare earth permanent magnets of Table 1.

| | Top Magnet (Y × Z × X mm) | Bot Magnet (Y × Z × X mm) | PM Orientation | Attraction @ 3.2 mm | Attraction @ 1.7 mm |
|---|---|---|---|---|---|
| 1 | 5.5 × 4.0 × 48 | 5.5 × 2.5 × 48 | vertical | 1654 | 3024 |
| | | | horizontal | 1810 | 3288 |
| 2 | 5.5 × 4.0 × 48 | 5.5 × 2.0 × 48 | vertical | 1424 | 2637 |
| | | | horizontal | 1561 | 2872 |
| 3 | 5.0 × 4.0 × 48 | 5.0 × 2.5 × 48 | vertical | 1497 | 2823 |
| | | | horizontal | 1624 | 3043 |
| 4 | 4.5 × 4.0 × 48 | 4.5 × 2.5 × 48 | vertical | 1287 | 2588 |
| | | | horizontal | 1424 | 2769 |
| 5 | 4.0 × 4.0 × 48 | 4.0 × 2.5 × 48 | vertical | 1150 | 2324 |
| | | | horizontal | 1223 | 2466 |
| 6 | 5.0 × 4.5 × 48 w/1-mm radii | 5.0 × 2.0 × 48 | vertical | 1209 | 2368 |
| | | | horizontal | 1302 | 2539 |

For example, in the sixth combination of Table 2, the top and bottom magnets arranged vertical to one another with opposing polarities to produce attraction exhibit attraction values of 1209 and 2368-grams at the distances of 3.2-mm and 1.7-mm, respectively. On the other hand, these same top and bottom magnets arranged horizontally with opposing polarities have greater attraction values of 1302 and 2539-grams at the distances of 6.55-mm and 3.5-mm, respectively. Given the data available in Tables 1 and 2, it is preferred that the embodiment of the magnetic latch and pop-up mechanism 50 having permanent magnets for each of the magnetic elements 62, 64, and 74 use a horizontal arrangement of the poles of the magnet.

From a mechanical standpoint, it may be desirable to select the sizes of magnets that produce the most repulsive and attractive forces. However, from a design standpoint, there may be limitations on the size of the permanent magnets that can be used due to space limitations in the device 10 and magnetic flux limitations from the magnets, along with other considerations discussed later. In addition, design of the disclosed magnetic latch and pop-up mechanism for a laptop computer preferably considers a number of practical mechanical issues, such as the ability to keep the display closed even if the laptop is dropped.

Figure 3A:
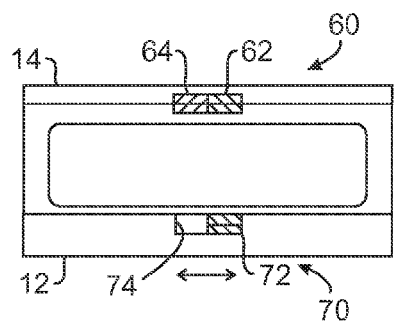

In the embodiment of the disclosed mechanism in FIGS. 2A-2B, the first component 60 having dual magnetic elements 62 and 64 is positioned on the body 12, while the second component 70 having the movable magnetic element 72 is positioned on the display 14. However, as shown in FIG. 3A, it will appreciated that a reverse arrangement with the movable element 72 on the body 12 and the dual elements 62 and 64 on the display 14 can also be used to achieve both latching and pop-up. Not only is a reverse arrangement applicable to the embodiment of FIGS. 2A-2B, but reverse arrangements are applicable to other embodiments of the present disclosure.

Figure 3B:
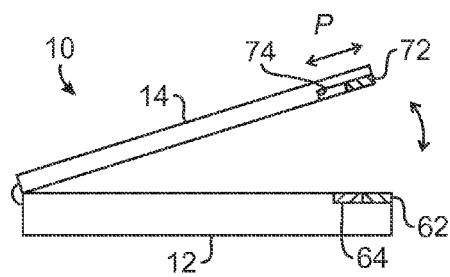

In the embodiment of the disclosed mechanism in FIGS. 2A-2B, the movable magnetic element 72 slides relative to the edge of the display 14 (i.e., slides in direction S left to right). However, the movement of the movable element 72 can be achieved by a number of techniques, such as sliding, pushing, rotating, flipping, etc. In an embodiment of the disclosed mechanism shown in FIG. 3B, for example, the movable element 72 slides in and out relative to the edge of the display 14 (i.e., pushes in direction P) like a button activated by the user.

Figure 3C:
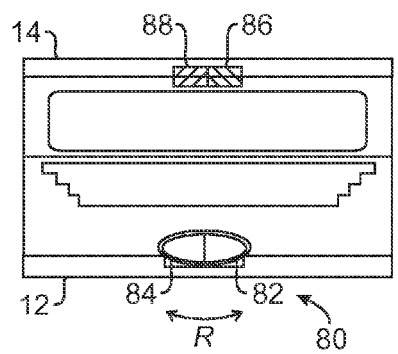

In another embodiment of the disclosed mechanism shown in FIG. 3C, a movable element 80 of the disclosed latch mechanism is rotatably positioned on the body 12 and has a first magnetic element 82 positioned adjacent a second magnetic element 84. The first element 82 is attracted to element 86 on the display 14 and is repulsed by element 88 on the display 14. Likewise, the second element 84 is attracted to element 88 and is repulsed by element 86. Thus, by rotating the arrangement of the elements 82/84 relative to elements 86/88, the user can latch the display 14 closed or pop-up the display 14 from the body 12.

Figure 3D:
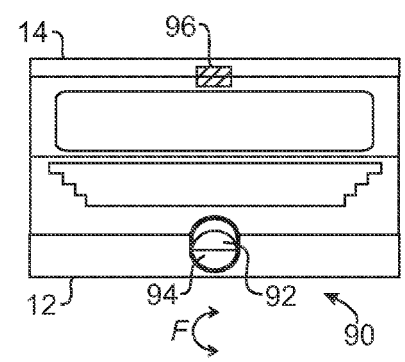

In yet another embodiment of the disclosed mechanism shown in FIG. 3D, a movable element 90 of the mechanism is positioned on the body 12 and has a first magnetic element 92 positioned adjacent a second magnetic element 94. The movable element 90 flips in direction F on the body 12. A corresponding element 96 on the display is magnetically attracted to the first element 92 and is magnetically repulsed by the second element 94. Thus, by flipping the arrangement of the first and second elements 92/94, the user can latch the display 14 closed or pop-up the display 14 from the body 12.

As each of the embodiments of the disclosed mechanism shown in FIGS. 2A through 3D illustrate, it is preferred that the latch and pop-up mechanism be used near the leading edge of the display 14 and body 12 of the device 10, which is typically opposite the edge where the hinges 16 between the display 14 and body 12 are located. This location is preferred because applying force at the leading edge best overcomes friction and weight of the display 14 for pop-up. However, it will be appreciated that the disclosed latch and pop-up mechanism can be positioned in other locations on the device 10 depending on the type of electronic device employed.

In the embodiment of the disclosed mechanism shown in FIGS. 2A-2B and other embodiments disclosed herein, the mechanism 50 achieves both latching and pop-up between the display 14 and body 12. In other embodiments, however, the disclosed mechanisms can be used to achieve either latching or pop-up functions exclusive of the other. For example, in one embodiment for latching only, a first magnetic component 60 shown in FIG. 3D can have only one magnetic element (e.g., element 62) and no second element. Thus, the movable element 72 in the closed state is attracted to the sole element 62, and the movable element 72 in the open state is moved away from the sole element 62. In another embodiment for pop-up only, a first magnetic component 60 shown in FIG. 3E can have only one magnetic element (e.g., element 64) and no second element. Thus, a movable element 72 on the display 14 in the closed state can mechanically latch to a catch 66 on the body 12. The movable element 72 in the open state is moved adjacent the sole element 64 and is repulsed thereby to pop-open the display 14.

Referring to FIGS. 4A and 4B, an embodiment of a button arrangement for moving a second magnetic component 70 relative to a first magnetic component 60 is illustrated. The button arrangement includes a button 52 slideably positioned in a slot 51 defined in the housing of the display 14. The button 52 has a portion 54 connected to the second magnetic component 70, which is a permanent magnet 72 in the present embodiment. A user slides the button 52 in the slot 51 to move the magnet 72 relative to the second magnetic component 60, which in the present embodiment also includes two permanent magnets 62 and 64.

As best shown in the side view of FIG. 4B, the magnets of the first magnetic component 60 are positioned in a holder 56 attached to the housing of the body 12. The surfaces of these magnets may be exposed on the surface of the body 12. The movable magnet of the second magnetic component 70 is positioned in another holder 58 attached to the housing of the display 14. In one embodiment, the holders 56 and 58 maintain a distance between the magnetic components 60 and 70 of about 0.7-mm when the display 14 is closed against the body 12. In addition, the holders 56 and 58 position the magnetic components 60 and 70 about 4.3-mm from the leading edges of the display 14 and body 12.

As further shown in the side view of FIG. 4B, a number of components of the electronic device 10 may be located near the disclosed latch and pop-up mechanism 50. In the example laptop, for example, an edge of a LCD panel 15 in the display 14 and portion of a mouse touch pad 13 in the body 12 may be positioned near the disclosed mechanism 50. Other components 11, such as internal electronics of the laptop device 10, may also be positioned near the disclosed mechanism 50. Therefore, it will be appreciated that having magnetic components 60 and 70 on the laptop 10 can pose potential problems to these adjacent electronic components 11, 13, and 15.

In one potential problem, magnetic flux from the magnetic components 60 and 70 may interfere with the electronic components 11, 13, and 15 of the laptop 10. It is calculated that embodiments of the disclosed mechanism 50 may produce 0.2 Tesla of magnetic flux when the display 14 is closed and that the magnetic flux may affect an area of about 2-3-cm within of the laptop 10. To overcome potential interference, magnetic flux from the magnetic components 60 and 70 can be localized to prevent affecting the electronic components 11, 13, and 15. In one example, the magnetic components 60 and 70 can be physically separated as far as possible from the electronic components 11, 13, and 15 to prevent interference. In other examples, techniques known in the art for shunting and shielding the magnetic components 60 and 70 can be employed.

In addition to magnetic effects, design of the disclosed mechanism 50 preferably considers the amount of movement required to move the magnetic components 60 and 70 between attraction to repulsion. Furthermore, design of the disclosed mechanism 50 preferably considers the amount of repulsive force to sufficiently pop-up the display 14. Given these design considerations, it is preferred to divide the magnetic components 60 and 70 into a plurality of discrete magnetic elements. In a preferred embodiment, latch travel to produce the open and closed states is preferably about 25-mm or less. In this preferred embodiment, a plurality of discrete neodymium magnets are arranged in a line and given alternating polarity, as will be discussed in further detail below.

Figure 5A:
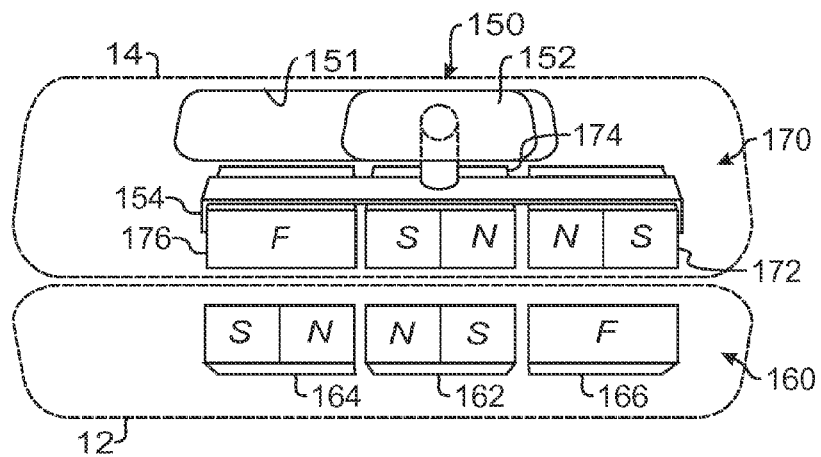
FIGS. 5A-5C illustrate another embodiment of a latch and pop-up mechanism according to certain teachings of the present disclosure.
Figure 5B:
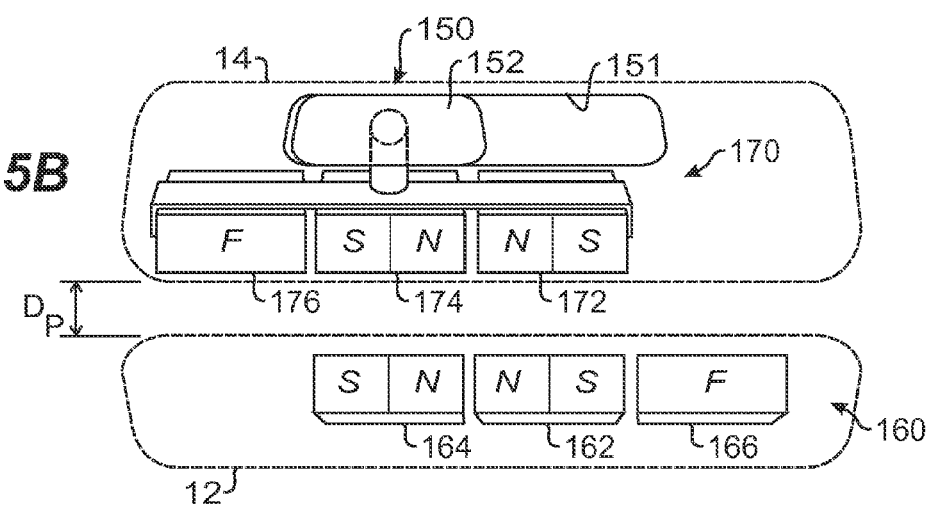
Figure 5C:
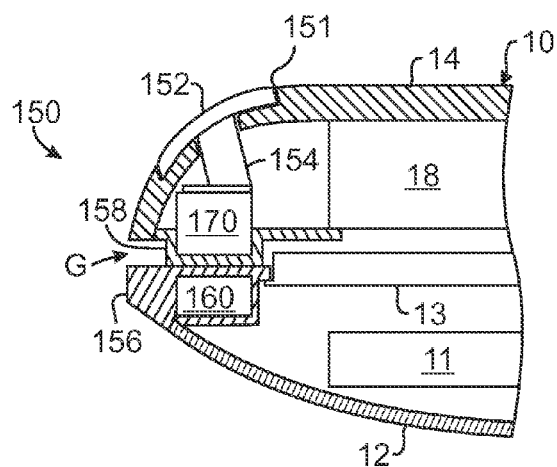

Referring to FIGS. 5A-5C, another embodiment of a latch and pop-up mechanism 150 according to certain teachings of the present disclosure is illustrated. A first magnetic component 160 in the body 12 has a plurality of permanent magnets 162 and 164 and has a ferromagnetic element 166. Similarly, a second magnetic component 170 in the display 14 has a plurality of permanent magnets 172 and 174 and has a ferromagnetic element 176. For both components 160 and 170, the magnets and ferromagnetic elements are arranged in a line, and the poles of the magnets are arranged horizontally along the line of the arrangement of magnets.

As before, a button 152 slideably positioned in a slot 151 defined in the housing of the display 14. The button 152 has a portion 154 connected to the second magnetic component 170. A user slides the button 152 in the slot 151 to move the magnetic component 170 relative to the second magnetic component 160. Each of the permanent magnets 162, 164, 172, 174 is preferably a neodymium N-48 magnet, and each component 160 and 170 preferably defines approximately 25-mm of active magnetic length.

As shown in FIG. 5A, the movable component 170 in a closed state (e.g., slid to the right) positions magnet 172 in magnetic attraction to ferromagnetic element 166, magnet 174 in magnetic attraction to magnet 162, and ferromagnetic element 176 in magnetic attraction to magnet 164. In this closed state, the display 14 is held substantially closed against the body 12. As shown in FIG. 5B, the movable component 170 in an open state (e.g., slid to the left) positions magnet 172 in magnetic repulsion to magnet 162, magnet 174 in magnetic repulsion to magnet 164, and ferromagnetic elements 176 and 166 away from magnets. In this open state, the display 14 is substantially popped-up a distance $D_P$ from the body 12.

It is preferred that the pop-up distance $D_P$ is about 4.8-mm, which combined with a pre-existing G of about 1.5-mm shown in FIG. 5C would give a total pop-up distance of about 6.3-mm. Furthermore, it is preferred that the sliding distance of the first component 170 is as small as possible. Having the 25-mm of active magnetic length, the sliding distance required by the second magnetic component 170 of the present embodiment is about 25-mm. These values can vary depending on the size of magnets used, their orientation to one another, their distances from one another, and the device 10 in which they are used, etc. As noted above, there are a number of tradeoffs and design choices to be made, which would be winging the abilities of one ordinarily skilled in the art having the benefit of the present disclosure.

As shown in the cross-section of FIG. 5C, the leading edges of the display 14 and body 12 define the pre-existing gap G, which can be about 1.5-mm. The second component 170 in the display 14 has an upper shroud 158 so that the surface of this component 170 is not exposed when the display 14 is opened. Similarly, the first component 160 in the body 12 has a lower shroud 156 so that the surface of this component 160 is not exposed when the display 14 is opened. In one embodiment, the upper shroud 158 is approximately 0.5-mm thick metal, such as aluminum, and the lower shroud 156 is approximately 0.8-mm thick plastic. This produces a nominal distance between the magnetic components 160 and 170 of about 1.3-mm when the display 14 is closed. The preferred pop-up travel between the components 160 and 170 in the open state is preferably at least 3.5-mm so that an entire pop-up distance of about 4.8-mm can be achieved.

Figure 6A:
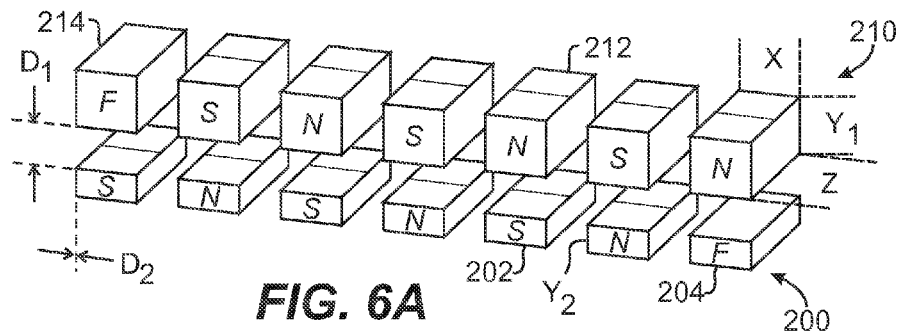
FIGS. 6A-6B illustrate an embodiment of first and second components having a plurality of magnetic elements with a polarity configuration.
Figure 6B:
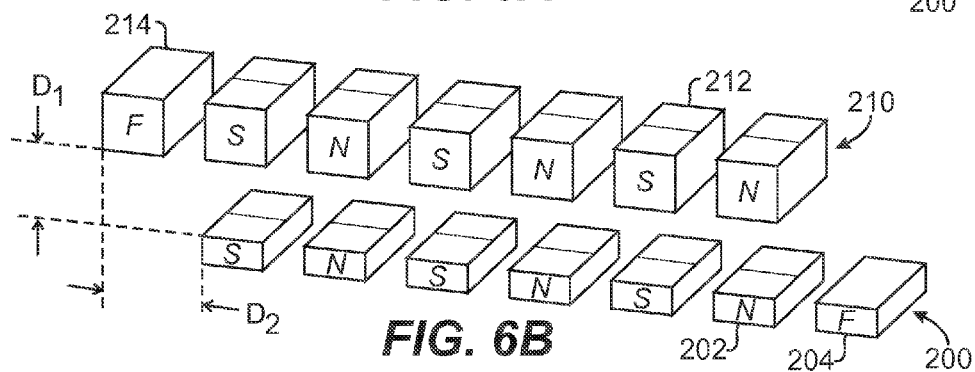

There are various numbers and orientations of magnets and ferromagnetic elements that can be used for the magnetic components of the disclosed latch and pop-up mechanisms. Referring to FIGS. 6A-6B, an embodiment of first and second components 200 and 210 are illustrated isolated from the housings of the display and body. As discussed previously, the first component 200 is positioned in the body (not shown), and the second component is positioned in the display (not shown). FIG. 6A represents the arrangement of the components 200 and 210 when the display is closed against the body and the components 200 and 210 are magnetically attracted to one another. Conversely, FIG. 6B represents the arrangement of the components 200 and 210 when the display is popped-up from the body and the components 200 and 210 are magnetically repulsed by one another.

The first component 200 has a plurality of first magnetic elements 202, 204 with a first polarity configuration, and the second component 210 has a plurality of second magnetic elements 212, 214 with a second polarity configuration. The first magnetic elements 202, 204 include six permanent magnets 202 and a ferromagnetic element 204 (e.g., composed of steel) arranged in a line. These permanent magnets 202 are arranged with their poles having a horizontal and alternating polarity configuration. Conversely, the second magnetic elements 212, 214 include a ferromagnetic element 214 (e.g., composed of steel) and six permanent magnets 212 arranged in a line. These permanent magnets 212 are also arranged with their poles having a horizontal and alternating polarity configuration.

The polarity configuration of the first component 200 is arranged to be attracted to the polarity configuration of the second component 210 when the two components 200 and 210 are substantially aligned (e.g., distance $D_2$ is substantially zero), as shown in FIG. 6A. For example, North and South poles of first magnets 202 are arranged to be attracted to a reverse arrangement of South and North poles of second magnets 212, and each ferromagnetic element 204/214 of a component is arranged to be attracted to one of the magnets 212/202 of the other component. Moreover, the polarity configurations of the components 200 and 210 are arranged to be repulsed by one another when the two components 200 and 210 are moved relative to one another, as shown in FIG. 6B. For example, North and South poles of first magnets 202 are arranged to be repulsed by a reverse arrangement of South and North poles of second magnets 212, and each ferromagnetic element 204/214 is not arranged to align with a magnet.

In one embodiment, the first magnetic elements 202, 204 each have dimensions (X, $Y_2$, Z) of about 4, 2, and 5-mm, and the second magnetic elements 212, 214 each have dimensions (X, $Y_1$, Z) of 4, 4, and 5-mm. In addition, the first magnetic component 200 has a distance D1 of about 1.7-mm from the second magnetic component 210 when the display and body are closed. To achieve pop-up, the components 200, 210 are moved relative to one another by a distance $D_2$ in FIG. 6B, which aligns opposing magnets by one interval. Once moved, the components 200, 210 repulse one another and separate a distance $D_1$ in FIG. 6B of approximately 6.55-mm.

Figure 7A:
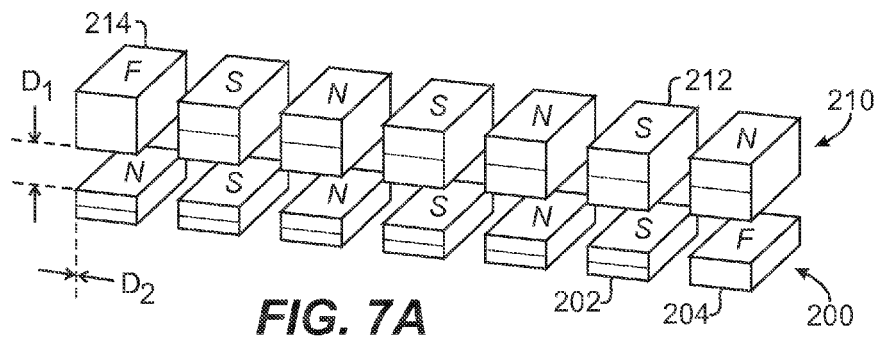
FIGS. 7A-7B illustrate another embodiment of first and second components having a plurality of magnetic elements with another polarity configuration.
Figure 7B:
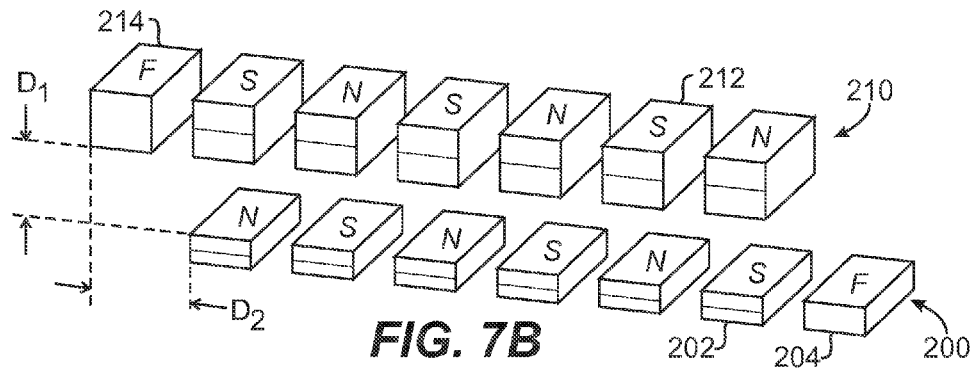

Referring to FIGS. 7A-7B, another embodiment of first and second components 200 and 210 are illustrated isolated from the housings of the display and body. As with the previous embodiment, each component 200/210 has six permanent magnets 202/212 and a ferromagnetic element 204/214 arranged in a line. In contrast to the previous embodiment, however, the permanent magnets 202/212 of the two components 200 and 210 are arranged with their poles having a vertical and alternating polarity configuration. When aligned for attraction, for example, North poles of first magnets 202 are arranged to be attracted to South poles of second magnets 212 and vice versa. In addition, each ferromagnetic element 204/214 of a component is arranged to be attracted to one of the magnets 212/202 of the other component. When aligned for repulsion, for example, North poles of first magnets 202 are arranged to be repulsed by North poles of second magnets 212 and vice versa. In addition, each ferromagnetic element 204/214 is not arranged to align with a magnet. The distances $D_1$ and $D_2$ and dimensions X, Y, and Z associated with the embodiment of FIGS. 7A and 7B can be substantially the same as the embodiment of FIGS. 6A and 6B.

Figure 8:
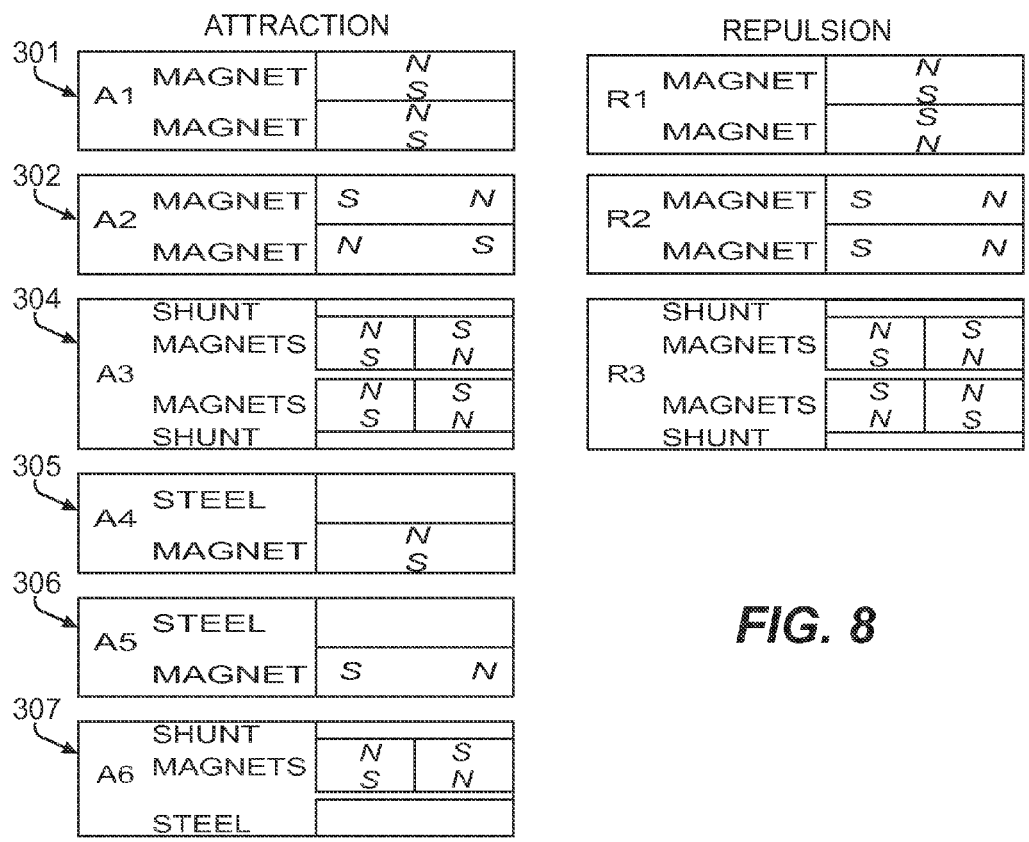
FIG. 8 illustrates a plurality of polarity configurations for magnetic elements.

The different polarity configurations disclosed above with reference to FIGS. 5A-5C, 6A-6B, and 7A-7B show that a number of polarity configurations can be used for both attraction and repulsion between the magnetic components of the disclosed latch and pop-up mechanism. Referring to FIG. 8, a plurality of polarity configurations are illustrated for use with magnetic elements according to various embodiments of the present disclosure.

In a first polarity configuration 301, a first (upper) permanent magnet has vertically arranged poles, and a second (lower) permanent magnet also has vertically arranged poles. As shown, the vertically arranged poles of the magnets can be arranged for attraction (A) and repulsion (R). In second polarity configuration 302, both upper and lower permanent magnets have horizontally arranged poles, and the horizontally arranged poles can be arranged for attraction (A) and repulsion (R).

In a third polarity configuration 303, two upper permanent magnets have a shunt composed of ferromagnetic material, and each upper magnet has vertically arranged poles that are oppositely oriented from the other. These two upper permanent magnets are repulsed by two lower permanent magnets also having a shunt and vertically arranged poles. As shown, the upper and lower magnets with shunts can be arranged for attraction (A) and repulsion (R).

In a number of other polarity configurations 304, 305, 306 either the upper or the lower element is a ferromagnetic material (e.g., steel), and the other element has one or more permanent magnets with any number of pole arrangements. These polarity configurations 304, 305, and 306 can be arranged for attraction (A).

It will be appreciated that these polarity configurations are not exhaustive and that additional configurations may be possible. For example, additional polarity configuration can be used that have switched arrangement of magnetic elements or switched orientations of magnetic poles from this illustrated in FIG. 8.

Figure 9:
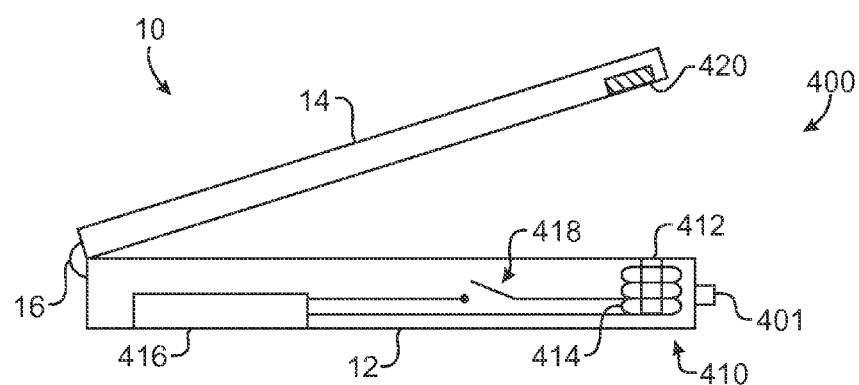
FIG. 9 illustrates an embodiment of the disclosed latch and pop-up mechanism having an electromagnet and a permanent magnet.

Referring to FIG. 9, yet another embodiment of a latch and pop-up mechanism 400 according to certain teachings of the present disclosure is illustrated in a side view. The mechanism 400 includes an electromagnet 410 positioned on the body 12 and includes a permanent magnet 420 positioned on the display 14. The electromagnet 410 has a ferromagnetic core 412 wrapped by a coil 414, which is connected to a power source or battery 416. In one embodiment, the power source or battery 416 is the same used to power the electronic device 10. Alternatively, the power source or battery 416 can be an independent supply of power to the electromagnet 410.

The electromagnet 410 operates in an energized condition to produce an open state and in an unenergized condition to produce a closed state. In the unenergized condition, internal electronics (not all shown), which includes a switch 418 for connecting the coil 414 to the battery 416, cause the electromagnet 410 to be disconnected from the battery 416. Thus, the permanent magnet 420 on the display 14 is magnetically attracted to the ferromagnetic material of the core 412 and can maintain the display 14 closed against the body 12.

To produce the energized condition, the user pushes an external button 401 to activate the internal electronics (such as switch 418) and to connect the coil 414 to the battery 416. Current is supplied to the coil 414 to energize the core 412. When energized, the electromagnet 410 produces a polarity opposite to that of the permanent magnet 420 in the display 14 and causes the magnet 420 to be magnetically repulsed by the energized electromagnet 410. The repulsion thereby causes the display 14 to pop-up a distance to allow the user to open the display 14.

In the embodiments of the disclosed latch mechanisms of FIGS. 2A through 5C discussed previously, a user may be required to move a movable element from an open state to a closed state when closing the display to magnetically latch the display against a body of the electronic device. In preferred embodiments of the disclosed latch and pop-up mechanisms, a movable component automatically resets from an open state to a closed state so that the user need not make that resetting movement. Referring to FIGS. 10A-10B, 11A-11B, and 12A-12B, a number of resetting techniques are disclosed for use with the disclosed latch mechanisms of the present disclosure. Although these resetting techniques are discussed in relation to components that resemble those of FIGS. 2A-2B, it will be appreciated that the resetting techniques disclosed below can be equally applied to other embodiments of latch and pop-up mechanisms disclosed herein.

FIGS. 10A-10B illustrate first and second magnetic components 60 and 70 actuated by a button 50. In FIG. 10A, the second (movable) magnetic component 70 is in a closed state, the magnet 72 is attracted to the opposite polarity of the magnet 62 by a attractive force A1, and the display 14 is maintained closed against the body 12. When a user slides the button 50 in slot 15 in direction S, the magnet 72 is also moved, and the magnetic attraction A1 is broken. In FIG. 10B, the magnet 72 has been moved to the open state and is repulsed by the same polarity of magnet 64 by repulsive force R. Due to the repulsion, the display 14 has popped-up a distance Dp from the body 12. To achieve the pop-up distance, the magnetic repulsion R between magnets 72 and 64 must typically overcome friction forces between the display 14 and the body 12, the weight of the display 14, etc.

After pop-up, the magnet 72 may remain in the open state, and the user can open the display 14 from the body 12. During closing, the user pushes the display 14 against the body 12, and the magnets 72 and 64 are brought into proximity to one another. The repulsive and attractive forces between all the magnets 62, 64, and 72 will cause the movable magnet 72 to move to the closed state as the display 14 is closed against the body 12. Consequently, embodiments of the movable element 70 can reset from the open to closed state.

Even after pop-up shown in FIG. 10B, however, the magnet 72 may still be attracted to the opposite polarity of magnet 62 by force A2. As is known, the magnetic forces between magnets depends on the distance between them. Therefore, the magnet 72 may reset to the closed state depending on the distance Dp and other variables (e.g., magnetic strengths of magnets 62, 64, and 72). When resetting, the magnet 72 may return freely in the opposite direction of S to the closed state because of the forces A2 and R will tend to move the magnet 72 and the user will have typically released the button 50 after pop-up of the display 14. Thus, if the attractive force A2 at distance Dp is not strong enough to overcome the friction between the display 14 and body 12, the magnets 72 and 62 may not cause the display 14 to close right after pop-up. Consequently, the display 14 can remain popped-up from the body 12, and the user can open the display 14. When closing, the user pushes the display 14 closed against the body 12. Because the magnet 72 is already in the closed state, it will be attracted to the magnet 62 to keep the display 14 closed against the body 12.

If the attractive force A2 at distance $D_P$ in FIG. 10B is strong enough to overcome the friction between the display 14 and body 12, the magnets 72 and 62 may cause the display 14 to close right after pop-up. In other words, the user may slide the movable element 70 from closed state to open state, the display 14 may pop-up from the body 12, the user will typically release their hold on button 50, the movable element 70 may automatically return to the closed state, and the display 14 may immediately close before the user has a chance to pry the display 14 open from the body 12. For arrangements where the display 14 may tend to close right after pop-up, it is preferred to prevent return on the magnet 72 to the closed position.

In FIGS. 11A-11B, a biasing force F from a spring or the like biases the movable element 70 toward the open state. In FIG. 11A, the spring is shown extended. When the display 14 is closed and the movable element 70 is in the closed state as shown in FIG. 11A, the attractive force A between movable magnet 72 and magnet 62 will overcome the spring force from a spring 500 and will maintain the display 14 closed. After the user slides the movable element in direction S, the display 14 will pop-up distance Dp from the body 12, as shown in FIG. 11B. The spring 500 can prevent the movable element 70 from returning back to the closed state by overcoming the attractive force A2 between magnets 72 and 62 that may tend to move the movable element 72 back to the closed state. When closing, the spring 500 may be automatically overcome by the tendency of the movable element 70 to return to the closed state as the user pushes the display closed against the body 12.

In FIGS. 12A-12B, a catch 510 is used to prevent the return of the movable element 70 to the closed state, allowing the user the opportunity to open the display 14. As shown in FIG. 12A, the user slides the button 50 in direction S, and overcomes the force of the catch 510 to move the movable element 70 from the closed state to the open state. The catch 510 includes a biased mechanical component that physically holds the button 52 (and thereby the movable element 70 as well) in the open state after pop-up, as shown in FIG. 12B. In other words, the catch 510 preferably tends to keep the movable element 70 in the open state by overcoming the attractive and repulsive forces R and A2 tending to move the element to the closed state.

In one embodiment, the mechanical catch 510 may need to be disengaged by the user for the movable element 70 to return to the closed state for closing the display 14. Alternatively, the mechanical catch 510 may be automatically disengaged by the tendency of the movable element 70 to return to the closed state as the user pushes the display 14 ever closer against the body 12. For example, the magnetic forces between the magnet 72 and 64 increase as the distance between the magnets decreases (usually exponentially). At some point when the display 14 is close to the body 12 (preferably at a distance less than the pop-up distance Dp), the magnetic forces R and A2 will cause the button 52 to overcome the force of the catch 510, and the movable element 70 will automatically reset in the closed state.

The foregoing description of preferred and other embodiments is not intended to limit or restrict the scope or applicability of the inventive concepts conceived of by the Applicants. In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. An apparatus for latching a first body against a second body pivotally connected to the first body, comprising:
    a multi-pole magnetic component disposed within the first body, the multi-pole magnetic component comprising a first magnet and a second magnet having a first polarity and a second polarity, respectively, the first and second polarities being opposite of each other;
    a movable component disposed within the second body and having an open state and a closed state, the movable component comprising a magnetic element having the first polarity, wherein in the closed state, the magnetic element and the second magnet magnetically attract each other with a first attachment force that retains the first body against the second body, and in the open state the magnetic attraction between the magnetic element and the second magnet generates a second attachment force less than the first attachment force, and wherein the movable component is movable in a first direction to move the movable component to the open state and the movable component is movable in a second direction opposite the first direction to move the movable component from the open state to the closed state; and
    a biasing mechanism configured to apply a biasing force directly to the movable component that is greater than the second attachment force to maintain the movable component in the open state, wherein to maintain the first body substantially closed against the second body in the closed state, the first attachment force is greater than the biasing force.

2. The apparatus as recited in claim 1, wherein the biasing mechanism is a spring.

3. The apparatus as recited in claim 2, wherein in the open state, a repulsive magnetic force is created between the magnetic element and the first magnet.

4. The apparatus as recited in claim 3, wherein in the open state the repulsive magnetic force causes the second body to move away from the first body a pop up distance.

5. A laptop computer, comprising:
    a first body, comprising:
        a first magnetic component comprising a first magnet and a second magnet disposed within the first body and characterized as having a first polarity and a second polarity, respectively, the first and second polarities being opposite of each other; and
    a second body pivotally attached to the first body, the second body comprising:
        a second magnetic component disposed within the second body and characterized as having the first polarity and having an open state and a closed state, wherein in the closed state, the second magnetic component and second magnet magnetically attract each other with a first attachment force securing the first body and the second body together in the closed state, the second magnetic component being movable in a first direction to provide the closed state and the second magnetic component being movable in a second direction opposite the first direction to unsecure the first body and the second body in the open state by substantially reducing the magnetic attraction between the second magnetic component and the second magnet from the first attachment force to a second attachment force, and
    a biasing mechanism configured to apply a biasing force directly to the second magnetic component that is greater than the second attachment force to maintain the second magnetic element in the open state, wherein to maintain the first body substantially closed against the second body in the closed state, the first attachment force is greater than the biasing force.

6. The laptop computer as recited in claim 5, wherein the biasing mechanism is a spring.

7. The laptop computer as recited in claim 6, wherein in the open state, a repulsive magnetic force is created between the second magnetic component and the first magnetic component.

8. The laptop computer as recited in claim 7, wherein in the open state the repulsive magnetic force causes the second body to move away from the first body a pop up distance.

* * * * *